United States Patent

Takai

[19]

[11] Patent Number: 5,420,509
[45] Date of Patent: May 30, 1995

[54] MAGNETIC RESONANCE IMAGING APPARATUS

[75] Inventor: Hiroshi Takai, Tochigi, Japan

[73] Assignee: Kabushiki Kaisha Toshiba, Kawasaki, Japan

[21] Appl. No.: 22,017

[22] Filed: Feb. 24, 1993

[30] Foreign Application Priority Data

Feb. 26, 1992 [JP] Japan .................................. 4-039010

[51] Int. Cl.$^6$ ............................................. G01V 3/00
[52] U.S. Cl. .................................... 324/309; 324/307
[58] Field of Search ............... 324/300, 307, 309, 310, 324/312

[56] References Cited

U.S. PATENT DOCUMENTS 5,168,227 12/1992 Foo et al. ............................ 324/309

*Primary Examiner*—Louis Arana
*Attorney, Agent, or Firm*—Limbach & Limbach

[57] ABSTRACT

In a magnetic resonance imaging apparatus of a multi-slice scheme, data of a low frequency component in a phase-encoding direction are acquired from a predetermined number of slices within a predetermined repetition time corresponding to a desired contrast, data of a high frequency component in the phase-encoding direction are acquired from slices, which are different depending on a sign of a frequency thereof and which number is half the predetermined number of slices, within a repetition time shorter than the predetermined repetition time. Complex conjugate data of the acquired data or 0 data are utilized as data which are not acquired, thereby reconstructing images of the predetermined number of slices. Since data of slices that cannot be acquired due to shortening of the repetition time can be restored by utilizing the complex conjugate data or 0 data of the acquired data, the scanning time can be shortened without decreasing the number of slices to be acquired. In another magnetic resonance imaging apparatus, when the repetition time is short, the data acquisition time per slice is shortened accordingly, so that the number of slices that can be acquired within the minimum repetition time TR corresponds to the number of slices that can be acquired within the maximum repetition time TR.

12 Claims, 3 Drawing Sheets

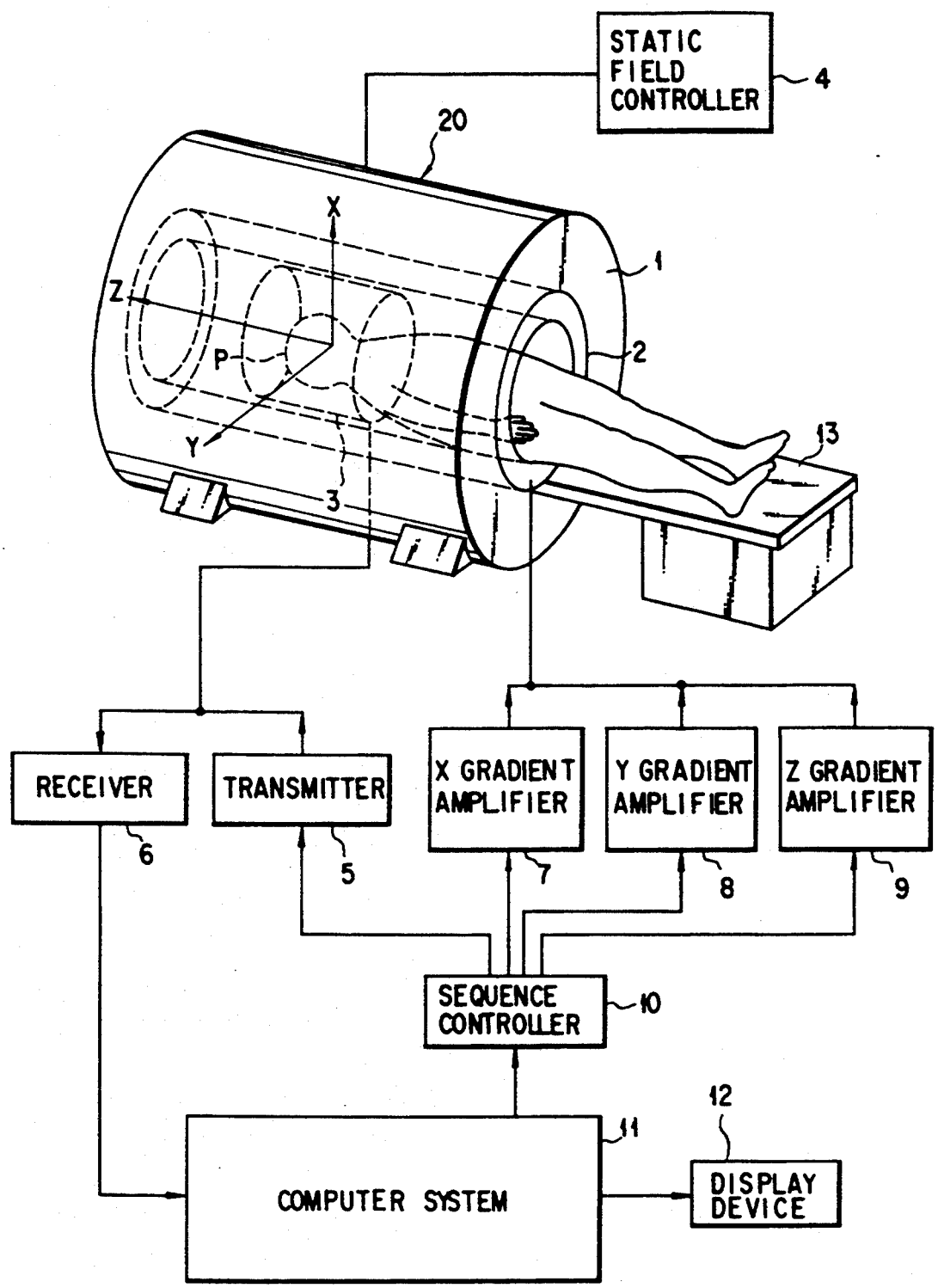
F I G. 1

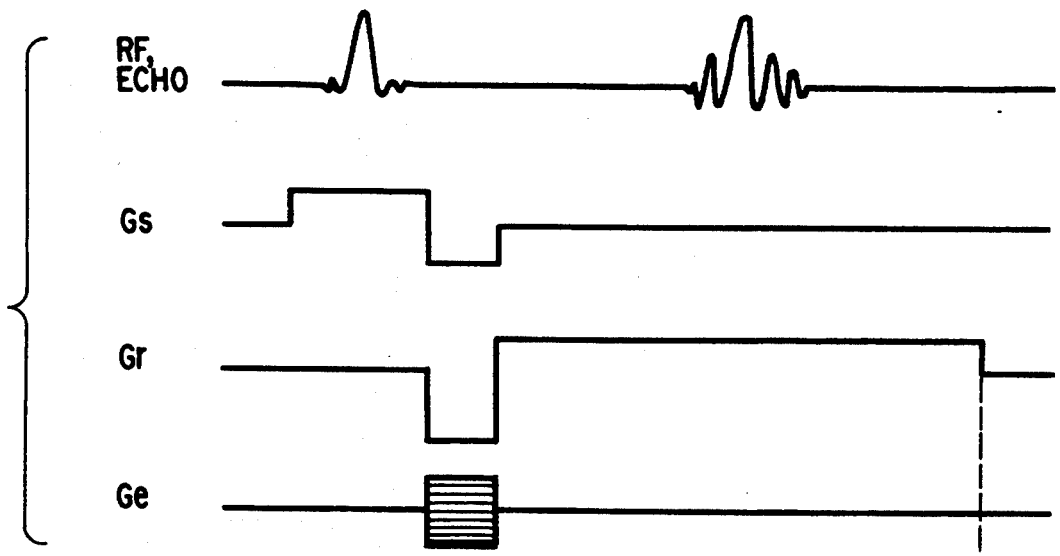
F I G. 2A
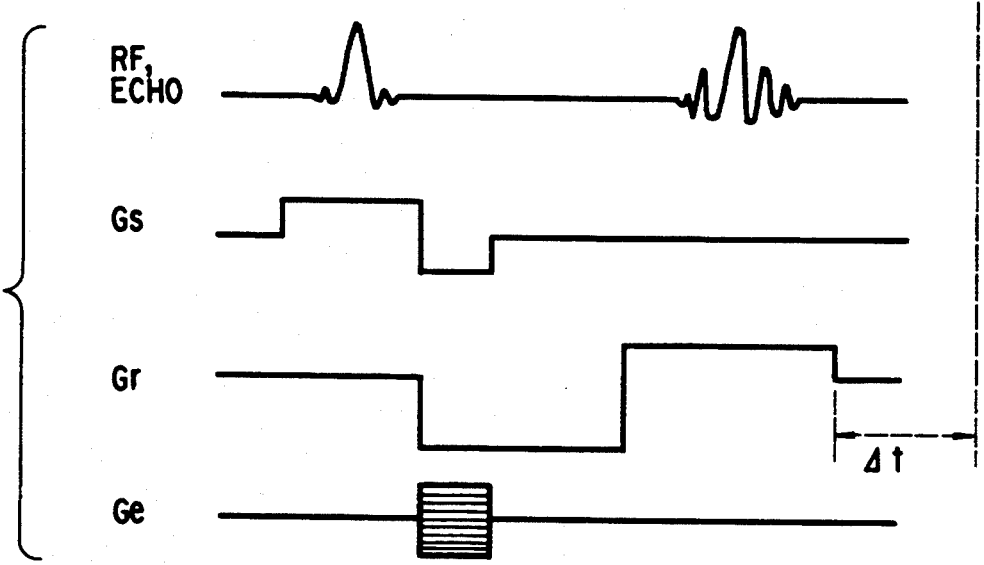
F I G. 2B

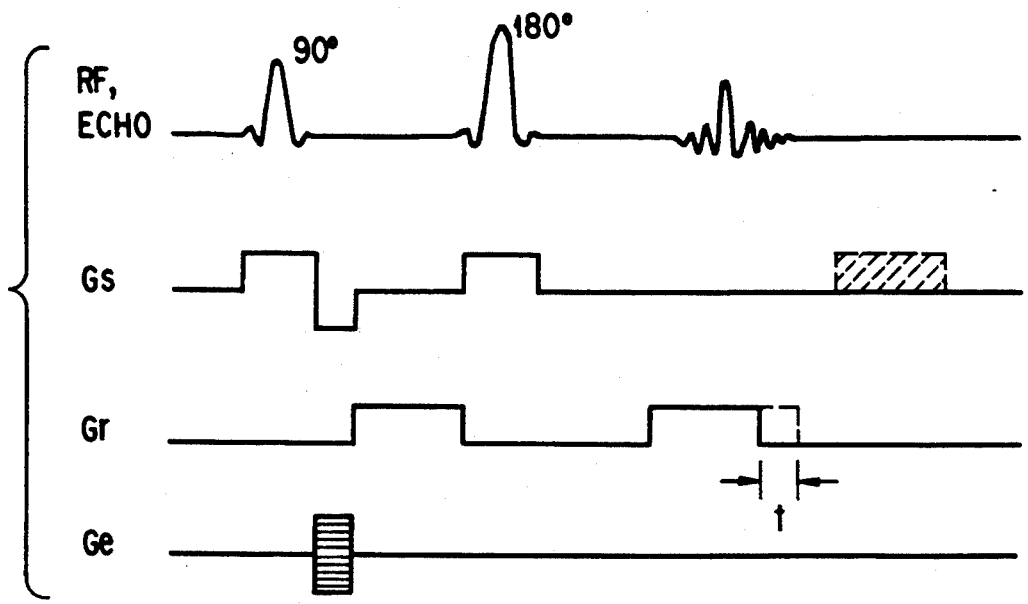
F I G. 3
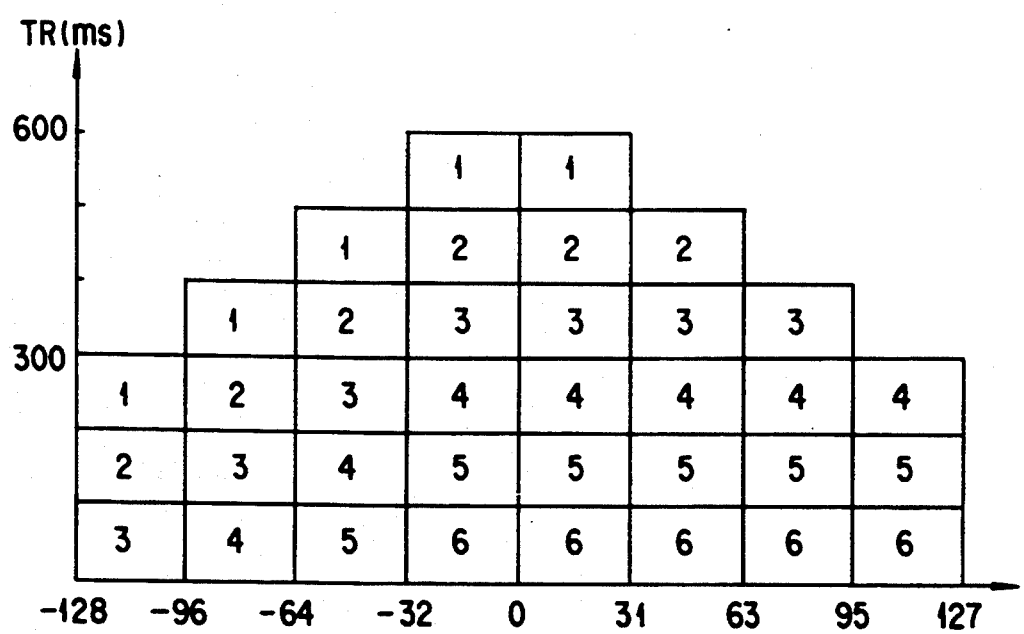
PHASE ENCODE STEP
F I G. 4

MAGNETIC RESONANCE IMAGING APPARATUS

BACKGROUND OF THE INVENTION

1. Field of the Invention

The present invention relates to a magnetic resonance imaging apparatus for performing multi-slice imaging based on a variable TR scanning scheme.

2. Description of the Related Art

Recently, a variable TR scanning scheme is developed in order to shorten the scanning time. According to this scheme, echo data is acquired not by setting a constant repetition time TR regardless of the value of the spatial frequency in the phase-encoding direction, but by changing the repetition time TR in accordance with the value of the spatial frequency component. Generally, the repetition time TR affects the contrast of an image. The contrast largely depends on the low frequency component of the image. A high frequency component does not much affect the contrast but rather affects the resolution. Therefore, when the spatial frequency in the phase-encoding direction is almost 0, the repetition time TR is set to a sufficiently long time for obtaining a contrast required for an image, and when the absolute value of the spatial frequency is large, thus not much affecting the contrast, the repetition time TR is set shorter than that for the spatial frequency of almost 0 in the phase-encoding direction. In this manner, according to the variable TR scanning scheme, the scanning time can be shortened.

When, however, the variable TR scanning scheme is applied to multi-slice imaging wherein a plurality of slices are excited within the repetition time TR, an inconvenience is caused. More specifically, in each encoding step, a time required for acquiring echo data per slice is predetermined, and the number of slices to be scanned within the repetition time TR is equal to (TR)/(time required for acquiring echo data per slice). Hence, the number of slices at the high-frequency component acquired by shortening the repetition time is smaller than the number of slices at the low-frequency component acquired by prolonging the repetition time.

Regarding a slice whose high-frequency component echo data are not obtained, an image of such a slice cannot be reconstructed by acquiring only its low-frequency component echo data. Therefore, in variable TR scanning multi-slice imaging, the number of slices is limited by the number of slices that can be acquired within the minimum repetition time TR. More specifically, in an encoding step having a repetition time TR longer than the minimum repetition time TR, although slice data corresponding to a larger number of slices than the number of slices that can be acquired within the minimum repetition time TR can be acquired, data acquisition is not performed in this step, and spin recovery is merely waited for in order to increase the contrast. For example, assume that only data corresponding to three slices can be acquired in a high-frequency encoding step. In this case, even if slice data corresponding to a larger number of slices can be acquired in a low-frequency encoding step having a long repetition time, as the high-frequency component data concerning resolution are not acquired, echo data corresponding to only three slices are acquired.

In this manner, according to the conventional magnetic resonance imaging apparatus for performing variable TR scanning, although the scanning time required for obtaining an image having a desired contrast can be shortened, the number of slices to be scanned within the repetition time TR is smaller than that obtained before the scanning time is shortened by shortening the repetition time TR.

SUMMARY OF THE INVENTION

Accordingly, it is an object of the present invention to provide a magnetic resonance imaging apparatus for executing variable TR scanning wherein the scanning time can be decreased without decreasing the number of slices.

According to one aspect of the present invention, there is provided a magnetic resonance imaging apparatus for acquiring data of a low frequency component in a phase-encoding direction from a predetermined number of slices within a predetermined repetition time corresponding to a desired contrast, acquiring data of a high frequency component in the phase-encoding direction from slices, which are different depending on a sign of a frequency thereof and which number is half the predetermined number of slices, within a repetition time shorter than the predetermined repetition time, and utilizing complex conjugate data or 0 data of the acquired data as data which are not acquired.

According to another aspect of the present invention, there is also provided another magnetic resonance imaging apparatus for acquiring data of a low frequency component in a phase-encoding direction from a predetermined number of slices within a predetermined repetition time corresponding to a desired contrast and with a predetermined acquisition time per slice, and acquiring data of a high frequency component in the phase-encoding direction from the predetermined number of slices within a repetition time shorter than the predetermined repetition time and with an acquisition time per slice shorter than the predetermined acquisition time per slice.

with the magnetic resonance imaging apparatus according to one aspect of the present invention, data of slices that cannot be acquired due to shortening of the repetition time can be restored by utilizing the complex conjugate data or 0 data of the acquired data, thereby shortening the scanning time without decreasing the number of slices to be acquired.

with the other magnetic resonance imaging apparatus according to another aspect of the present invention, the repetition time is shortened and a data acquisition time per slice is also shortened, so that the scanning time can be shortened without decreasing the number of slices to be acquired.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 1 is a block diagram showing the arrangement of a magnetic resonance imaging apparatus according to the first embodiment of the present invention;

FIGS. 2A and 2B show pulse sequences explaining the effect of increasing the sampling rate;

FIG. 3 is shows a pulse sequence for shortening, in the first embodiment, the data acquisition time per slice in each encoding step by advancing a timing of turning off a readout gradient field, and by shortening a time period during which a spoiler gradient field is applied, or by omitting to apply a spoiler gradient field; and FIG. 4 is a graph showing assignment of imaging slices in units of encoding steps.

DETAILED DESCRIPTION OF THE PREFERRED EMBODIMENTS

A preferred embodiment of a magnetic resonance imaging apparatus according to the present invention will now be described with reference to the accompanying drawings. Referring to FIG. 1, there is illustrated a magnetic resonance imaging apparatus of the present invention in block form. A static magnetic field forming magnet 1, an x-axis, y-axis, and z-axis gradient magnetic fields forming coil system 2, and a transmitter/receiver coil system 3 are installed in a gantry 20. The transmitter/receiver coil 3 may be directly attached to a human body P under examination instead of being embedded in the gantry.

The magnet 1, serving as a means of forming a static magnetic field, can be constructed of a superconducting or normal-conducting coil. The x-axis, y-axis, and z-axis gradient fields forming coil system 2 is adapted to generate an x-axis gradient field Gx, a y-axis gradient field Gy, and a z-axis gradient field Gz. The transmitter/receiver coil 3 emits a radio-frequency (RF) pulse serving as a selective excitation pulse for selecting a slice to be imaged of the human body P and detects a magnetic resonance signal (echo signal) generated by magnetic resonance induced in the selected slice. The human body P, laid down an examination couch 13, is allowed to have access to the imaging space within the gantry 20. The imaging space is a spherical space in which imaging magnetic fields are formed, and imaging diagnosis can be made only when an imaging portion of the human body lies within this space.

The static magnetic field forming magnet 1 is driven by a static field controller 4. The transmitter/receiver coil 3 is coupled to a transmitter 5 at the time of inducing magnetic resonance in the human body and to a receiver 6 at the time of detecting magnetic resonance signals from the human body. The x-axis, y-axis, and z-axis gradient fields forming coil system 2 is driven by x-axis, y-axis, and z-axis gradient field power supplies (amplifiers) 7, 8, and 9.

The x-axis, y-axis, and z-axis gradient field amplifiers 7, 8, and 9, and the transmitter 5 are driven by a sequence controller 10, thereby generating an x-axis gradient field Gx, a y-axis gradient field Gy, a z-axis gradient field Gz, and a radio-frequency (RF) pulse in accordance with a predetermined pulse sequence which will be described later. In this case, the gradient fields Gx, Gy, and Gz are used as a phase-encoding gradient field Ge, a readout gradient field Gr, and a slice-selection gradient field Gs, respectively. A computer system 11 drives and controls the sequence controller 10 and receives magnetic resonance signals from the receiver 6 for signal processing, thereby reconstructing a cross-sectional magnetic resonance (MR) image of the human body and displaying it on a display device 12.

The operation of this embodiment will be described. In this invention, a high spatial frequency component in the phase-encoding direction is set to have a short repetition time TR, and a low spatial frequency component in the phase-encoding direction is set to have a long repetition time TR, thereby performing multi-slice variable TR scanning. In variable TR scanning, if the data acquisition time per slice in each encoding step is predetermined, the number of slices is undesirably limited to the number of slices that can be acquired within the minimum repetition time TR, as described with reference to the prior art. Hence, in this embodiment, when the repetition time TR is short, the data acquisition time per slice is shortened accordingly, so that the number of slices that can be acquired within the minimum repetition time TR corresponds to the number of slices that can be acquired within the maximum repetition time TR. Then, all the data of the number of slices that can be acquired within the maximum repetition time TR can be acquired.

The means for shortening the data acquisition time per slice is as follows:

(1) The shorter the repetition time, the higher the sampling rate, while not changing the number of sampling points of the echo data, thereby shortening the sampling time. FIG. 2A shows a pulse sequence for the low spatial frequency component and FIG. 2B shows a pulse sequence for the high spatial frequency component. FIGS. 2A and 2B shows a pulse sequence of a gradient field scheme or field echo scheme. The shortened acquisition time $\Delta t$ is expressed by:

$$\Delta t = (SR_L - SR_H) \times SP/2$$

where $SR_L$ is a sampling interval between each of the sampling points in the case of the low frequency, $SR_H$ is a sampling interval between each of the sampling points in the case of the high frequency, and SR is a number of the sampling points. The computer system 11 controls the sampling intervals $SR_L$ and $SR_H$.

In this case, the upper limit of increasing the sampling rate is determined by the performance of the gradient field power supply.

(2) As another means of shortening the data acquisition time per slice, the sampling time may be shortened by changing the timing with which the readout gradient field Gr is applied. Usually, a readout gradient field Gr is applied until generation of the echo signal is ended, and is turned off, as indicated by a broken line in FIG. 3. In contrast to this, the readout gradient field Gr may be turned off at a time point slightly before an end of generation of the echo signal by a time t (determined by the repetition time TR and the number of slices to be imaged) for which the sampling time is to be shortened, as indicated by a solid line in FIG. 3. Then, although the number of sampling points may be decreased, data of the sampling points that are not acquired can be reproduced by using 0 data or complex conjugate data. The upper limit of the time to be shortened is limited by the resolution.

(3) As still another means for shortening the data acquisition time per slice, as shown in FIG. 3, in the sequence of applying a spoiler gradient field (hatched portion) in the slicing direction after data sampling, the time within which the spoiler is applied is shortened, or application of the spoiler is omitted, thereby shortening the acquisition time. In variable TR scanning, the repetition time of the high spatial frequency component in the phase-encoding direction is shortened. However, since transverse magnetization of the high frequency component in the phase-encoding direction is originally dispersed, application of the spoiler is not much needed. Therefore, even if the spoiler for an echo signal having a high frequency component is omitted, it does not much affect the quality of an image, and thus the data acquisition time per slice can be shortened. It is possible to apply the spoiler in the readout direction or phase-encode direction.

In this manner, according to the first embodiment, when the repetition time TR is short, the data acquisition time per slice is shortened so that the number of slices that can be acquired within the minimum repetition time TR corresponds to the number of slices that can be acquired within the maximum repetition time TR, thereby acquiring data of the number of slices which is the same as the data of the number of slices that can be acquired within the maximum repetition time TR. As a result, there is provided a magnetic resonance imaging apparatus capable of executing variable TR scanning, wherein the scanning time can be shortened without decreasing the number of slices.

If a slight decrease in number of slices within a shortened TR can be allowed, the data acquisition time per slice in each encoding step need not always be shortened to such a degree that the number of slices that can be acquired within the minimum repetition time TR corresponds to the number of slices that can be acquired within the maximum repetition time TR.

The second embodiment of the present invention will be described. In the second embodiment, the data acquisition time per slice in each encoding step is set predetermined, and although the number of slices that can be acquired within the minimum repetition time TR is smaller than the number of slices that can be acquired within the maximum repetition time TR, an image is reconstructed, after data acquisition, by reproducing data that cannot be acquired. To reproduce data, the complex conjugate data of the acquired data or mere 0 data may be used.

A case wherein data which is not acquired is to be reproduced by using the complex conjugate data of the acquired data will be described. Assume that the maximum repetition time TR=600 ms, the minimum repetition time TR=300 ms, and an acquisition time per slice of each encoding step is 100 ms (predetermined). Then, the number of slices that can be acquired within the minimum repetition time TR is three, and the number of slices that can be acquired within the maximum repetition time TR is six. In this embodiment, in an encoding step of a low frequency component having a long repetition time, data of all the slices are acquired, and in an encoding step of a high frequency component having a short repetition time, separate slice data are acquired for the positive and negative phase-encoding steps, and a part of data which is not acquired is reproduced from the complex conjugate data of the part of data which is acquired. Assignment of the slices which are acquired in encoding steps having the same absolute values but different signs is determined such that their complex conjugate data can be obtained.

FIG. 4 shows imaging slice numbers (figures in blocks) assigned in units of phase-encoding steps. For example, consider the 1st slice. Since the data of the 1st slices of the −128th to +31st encoding steps are actually acquired, the acquired data are directly used. Since the data of the 1st slices of the +32nd to +127th encoding steps are not acquired, they are reproduced by using the complex conjugate data of the 1st slices of the −32nd to −128th encoding steps.

In order to utilize the complex conjugate data, even within the minimum repetition time TR, slice data of an amount half that of the slice data within the maximum repetition time TR must be acquired. In this manner, slices of a number equal to 2×(minimum repetition time TR)/(acquisition time per slice) can be imaged.

As still another means for reproducing data which cannot be acquired, data are acquired in the same manner as with the conventional apparatus, but 0 data can be utilized as the data of a portion which cannot be acquired. Data acquisition may be performed in the same manner as shown in FIG. 4. In this case, since data of the 1st slices of the +32nd to +127th encoding steps are not acquired, 0 data are used in place of the complex conjugate data.

In this manner, according to the second embodiment, the scanning time can be shortened by utilizing the complex conjugate data or 0 data as data of a portion that cannot be acquired due to shortening of the repetition time, without decreasing the number of slices to be acquired. When the complex conjugate data is used, even within the minimum repetition time TR, slice data half that within the maximum repetition time TR must be acquired. In contrast to this, when the 0 data is used, such a limitation is not posed. However, if a slight decrease in number of slices caused by the shortened repetition time TR is allowed, in the same manner as in the first embodiment, even when the complex conjugate data is used, slice data half that within the maximum repetition time TR need not be acquired within the minimum repetition time TR.

As has been described above, according to the present invention, there is provided a magnetic resonance imaging apparatus capable of multi-slice imaging to execute variable TR scanning, wherein the scanning time can be shortened by shortening the repetition time without decreasing the number of slices.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, in the above description, the spin echo scheme has been described as the method of detecting an echo signal. However, any other scheme can be used. Assignment of slices acquired in each encoding step is not limited to FIG. 4, and various changes and modifications may be made. It suffices if each slice data is acquired for at least a positive or negative half of the phase-encoding steps.

What is claimed is:

1. A magnetic resonance imaging apparatus for executing a pulse sequence of acquiring echo data from a plurality of different regions within a predetermined repetition time, comprising:

(a) means for acquiring echo data of a low frequency component in a phase-encoding direction from n regions within the predetermined repetition time;

(b) means for acquiring echo data of a high frequency component in the positive phase-encoding direction from regions of a number smaller than n within a second repetition time shorter than the predetermined repetition time;

(c) means for acquiring echo data of a high frequency component in the negative phase-encoding direction from regions echo data of which are not acquired by said (b) means within the second repetition time;

(d) means for obtaining echo data of a high frequency component in the negative phase-encoding direction from the regions the echo data of which are acquired by said (b) means;

(e) means for obtaining echo data of a high frequency component in the positive phase-encoding direction from the regions the echo data of which are acquired by said (c) means; and (f) means for forming magnetic resonance images of the n regions by using the echo data acquired by said (b) means and (c) means and the echo data obtained by said (d) means and (e) means.

2. An apparatus according to claim 1, wherein
said (d) means obtains the echo data of the high frequency component of the negative phase encoding direction by using complex conjugate data of the echo data obtained by said (b) means, and
said (e) means obtains the echo data of the high frequency component of the positive phase encoding direction by using complex conjugate data of the echo data obtained by said (c) means.

3. An apparatus according to claim 1, wherein
said (d) means obtains the echo data of the high frequency component of the negative phase encoding direction by using 0 data as the echo data of the negative high frequency component, and
said (e) means obtains the echo data of the high frequency component of the positive phase encoding direction by using 0 data as the echo data of the positive high frequency component.

4. An magnetic resonance imaging apparatus for executing a pulse sequence of acquiring echo data from a plurality of different regions within a predetermined repetition time, comprising:

(a) means for acquiring echo data of a low frequency component in a phase-encoding direction from n regions within the predetermined repetition time while applying a readout gradient field having a predetermined application time;

(b) means for acquiring echo data of a high frequency component in the phase-encoding direction from the n regions within a second repetition time shorter than the predetermined repetition time while applying a readout gradient field an application time of which from an echo center to an application end is shorter than half the predetermined application time; and (c) means for forming magnetic resonance images of the n regions by using the echo data acquired by said (a) means and (b) means.

5. An magnetic resonance imaging apparatus for executing a pulse sequence of acquiring echo data from a plurality of different regions within a predetermined repetition time, comprising:

(a) means for acquiring a predetermined number of echo data of a low frequency component in a phase-encoding direction within the predetermined repetition time in units of regions at a predetermined sampling rate, thereby acquiring echo data from a total of n regions;

(b) means for acquiring the predetermined number of echo data of a high frequency component in the phase-encoding direction within the predetermined repetition time in units of regions at a sampling rate lower than the predetermined sampling rate, thereby acquiring echo data from a total of the n regions; and (c) means for forming magnetic resonance images of the n regions by using the echo data acquired by said (a) means and (b) means.

6. A magnetic resonance imaging method of varying a repetition time in accordance with a phase-encoding amount, comprising the following steps of:

acquiring echo data of a low frequency component in a phase-encoding direction from a predetermined number of slices within a predetermined repetition time corresponding to a desired contrast, and acquiring echo data of a high frequency component in the phase-encoding direction from slices, which are different depending on a sign of a frequency of the phase encoding direction and which number is at least half the predetermined number of slices, within a repetition time shorter than the predetermined repetition time;

restoring echo data of slices of high frequency components in the phase-encoding direction, which are not acquired in the acquiring step, by means of complex conjugate data of the echo data which are acquired; and reconstructing an image by using the echo data acquired in the acquiring step and the echo data reproduced in the restoring step.

7. A magnetic resonance imaging method of varying a repetition time in accordance with a phase-encoding amount, comprising the following steps of:

acquiring echo data of a low frequency component in a phase-encoding direction from a predetermined number of slices within a predetermined repetition time corresponding to a desired contrast, and acquiring echo data of a high frequency component in the phase-encoding direction from slices, which are different depending on a sign of a frequency of the phase-encoding direction and which number is at least half the predetermined number of slices, within a repetition time shorter than the predetermined repetition time; and reconstructing an image by using 0 data as the echo data of the high frequency component in the phase-encoding direction from slices which are not acquired in the acquiring step and on the basis of the echo data acquired in the acquiring step and the 0 data.

8. A magnetic resonance imaging method of varying a repetition time in accordance with a phase-encoding amount, comprising the following steps of:

acquiring echo data of a low frequency component in a phase-encoding direction from a predetermined number of slices within a predetermined repetition time corresponding to a desired contrast and with a predetermined acquisition time per slice, and acquiring echo data of a high frequency component in the phase-encoding direction from the predetermined number slices within a repetition time shorter than the predetermined repetition time and with the predetermined acquisition time per slice; and reconstructing an image by using the data acquired in the acquiring step.

9. A method according to claim 8, wherein the acquiring step comprises acquiring the echo data of the low frequency component in the phase-encoding direction at a predetermined sampling rate with a predetermined number of sampling times, and acquiring the echo data of the high frequency component in the phase-encoding direction at a sampling rate higher than the predetermined sampling rate with the predetermined number of sampling times.

10. A method according to claim 8, wherein the acquiring step comprises acquiring the echo data of the low frequency component in the phase-encoding direction while applying a readout gradient field for a predetermined period of time, and acquiring the echo data of the high frequency component in the phase-encoding direction while applying a readout gradient field for a time shorter than the predetermined period of time.

11. A method according to claim 8, wherein the acquiring step comprises applying a spoiler gradient field of a predetermined period of time in a slicing direction after the echo data of the low frequency component in the phase-encoding direction are acquired, and applying a spoiler gradient field of a time shorter than the predetermined period of time in a slicing direction after the echo data of the high frequency component in the phase-encoding direction are acquired.

12. A method according to claim 8, wherein the acquiring step comprises applying a spoiler gradient field of a predetermined period of time in a slicing direction after the echo data of the low frequency component in the phase-encoding direction are acquired, acquiring the echo data of the high frequency component in the phase-encoding direction, and immediately acquiring echo data of a next slice without applying a spoiler gradient field.

* * * * *